(12) United States Patent
Koto

(10) Patent No.: US 9,318,684 B2
(45) Date of Patent: Apr. 19, 2016

(54) SEMICONDUCTOR CERAMIC AND SEMICONDUCTOR CERAMIC ELEMENT

(71) Applicant: Kiyohiro Koto, Nagaokakyo (JP)

(72) Inventor: Kiyohiro Koto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 246 days.

(21) Appl. No.: 13/944,002

(22) Filed: Jul. 17, 2013

(65) Prior Publication Data

US 2014/0159191 A1 Jun. 12, 2014

Related U.S. Application Data

(63) Continuation of application No. PCT/JP2012/050773, filed on Jan. 17, 2012.

(30) Foreign Application Priority Data

Jan. 21, 2011 (JP) ................. 2011-010503

(51) Int. Cl.
*H01B 1/02* (2006.01)
*H01B 1/22* (2006.01)
(Continued)

(52) U.S. Cl.
CPC .............. *H01L 37/00* (2013.01); *C04B 35/462* (2013.01); *C04B 35/62675* (2013.01); *C04B 35/63416* (2013.01); *C22C 29/12* (2013.01);
(Continued)

(58) Field of Classification Search
CPC .................. B01J 23/002; B01J 2523/37; B01J 2523/3706; B01J 2523/3743; B01J 2523/3762; G01K 3/005; H01L 37/00

USPC ................ 252/513, 514; 257/467; 423/594.8; 429/495

See application file for complete search history.

(56) References Cited

U.S. PATENT DOCUMENTS 3,996,168 A 12/1976 Hoffmann et al.
5,015,461 A * 5/1991 Jacobson et al. ........... 423/594.8
(Continued)

FOREIGN PATENT DOCUMENTS

JP 06-58821 3/1994
JP 2009-511899 A 3/2009
(Continued)

OTHER PUBLICATIONS

A.P. Ramirez et al., "Zero-point entropy in 'spin ice'", Nature, vol. 399, May 1999, pp. 333-335.*

(Continued)

*Primary Examiner* — Khanh Tuan Nguyen
(74) *Attorney, Agent, or Firm* — Arent Fox LLP

(57) ABSTRACT

Provided is a semiconductor ceramic element constructed by using a semiconductor ceramic that generates metal-insulator transition at a temperature of actual use and has a sufficient strength to enable easy handling. The semiconductor ceramic element has an element main body having a semiconductor ceramic made of a perovskite-type or pyrochlore-type oxide containing a rare earth element, nickel, and titanium, in which a part of the nickel is present as metal nickel; and a pair of electrodes formed to interpose the element main body therebetween. This semiconductor ceramic element shows a sharp resistance change within a temperature range of actual use, and can be used advantageously as a temperature sensor.

6 Claims, 16 Drawing Sheets

(51) Int. Cl.
*H01L 37/00* (2006.01)
*G01K 3/00* (2006.01)
*G01K 7/16* (2006.01)
*H01C 7/04* (2006.01)
*C04B 35/462* (2006.01)
*C04B 35/626* (2006.01)
*C04B 35/634* (2006.01)
*C22C 29/12* (2006.01)
*H01F 1/40* (2006.01)
*C22C 19/03* (2006.01)

(52) U.S. Cl.
CPC *G01K 3/005* (2013.01); *G01K 7/16* (2013.01); *H01C 7/045* (2013.01); *H01F 1/407* (2013.01); *C04B 2235/3224* (2013.01); *C04B 2235/3227* (2013.01); *C04B 2235/3232* (2013.01); *C04B 2235/3279* (2013.01); *C04B 2235/76* (2013.01); *C04B 2235/768* (2013.01); *C22C 19/03* (2013.01)

(56) References Cited

U.S. PATENT DOCUMENTS 7,215,236 B2 5/2007 Rosc et al.
7,597,817 B1* 10/2009 Li .................. C01G 23/006
 252/62.51 R
2008/0297358 A1 12/2008 Kim et al.
2011/0033779 A1* 2/2011 Badding et al. ............. 429/495

FOREIGN PATENT DOCUMENTS

WO WO-2005/044730 A1 5/2005
WO WO-2005/064598 A1 7/2005

OTHER PUBLICATIONS

Rodriguez, E. et al., Structural, Electronic and Magnetic Characterization of the Perovskite LaNi1-xO3($0 \leq x \leq 1/2$), Journal of Solid State Chemistry, 1999, Vo. 148, pp. 479-486.
Yakovlev, S. et al., Mixed conductivity, thermal expansion and defect chemistry of A-site deficient LANi0.5Ti0.5O3-8, Journal of the European Ceramic Society, 2007, vol. 27, pp. 4279-4282.
Katsufuji, T. et al., Transport and magnetic properties of a Mott-Hubbard system whose bandwidth and band filling are both controllable: R1-xCaxTiO3xy/2", vol. 56, No. 16, pp. 1-9, dated Oct. 15, 1997-II.
International application No. PCT/JP2012/050773, PCT Written Opinion of the Internation Searching Authority, date of mailing Feb. 2, 2012.
International Search Report, PCT/JP2012/050773, date of mailing Feb. 21, 2012.

* cited by examiner

Fig. 5(A)
Fig. 5(B)
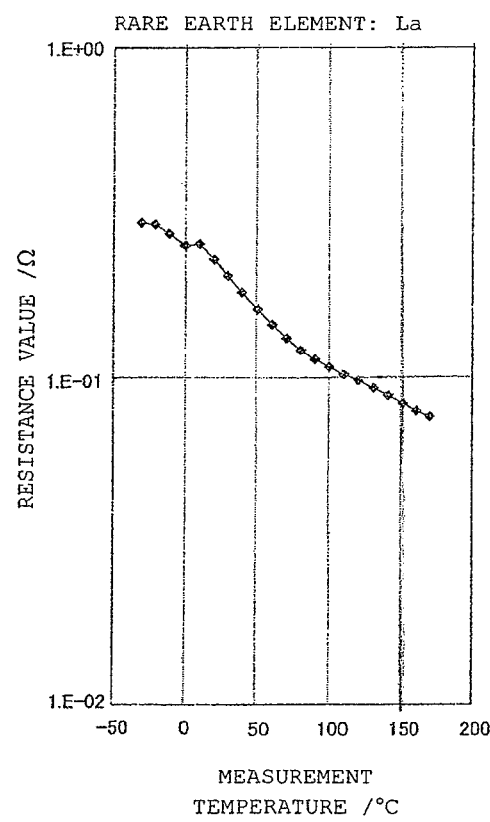
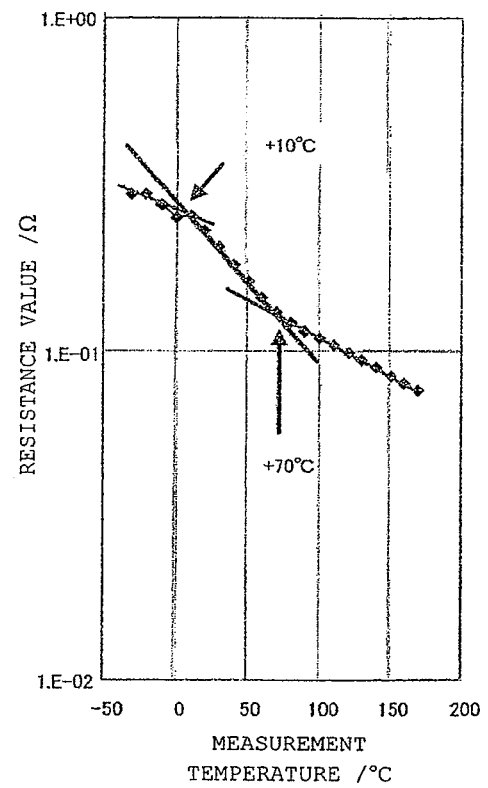

Fig. 9(A)
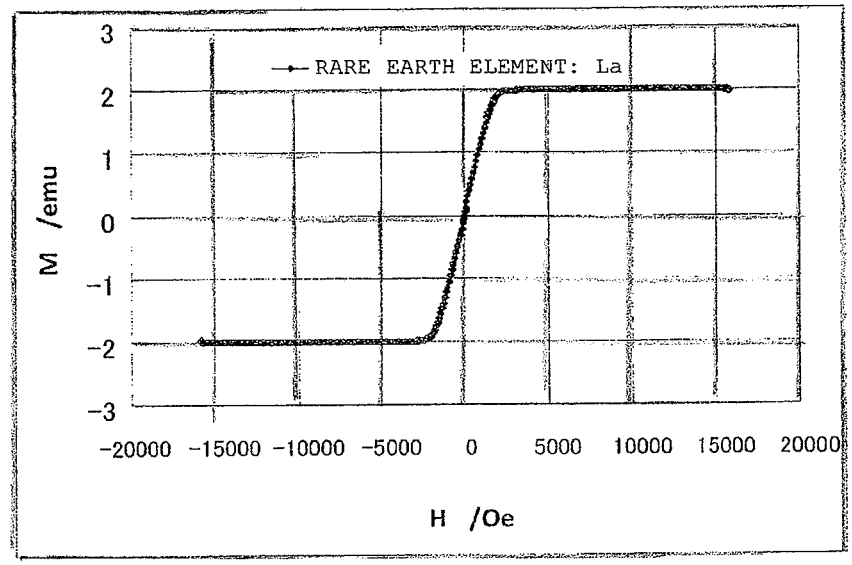
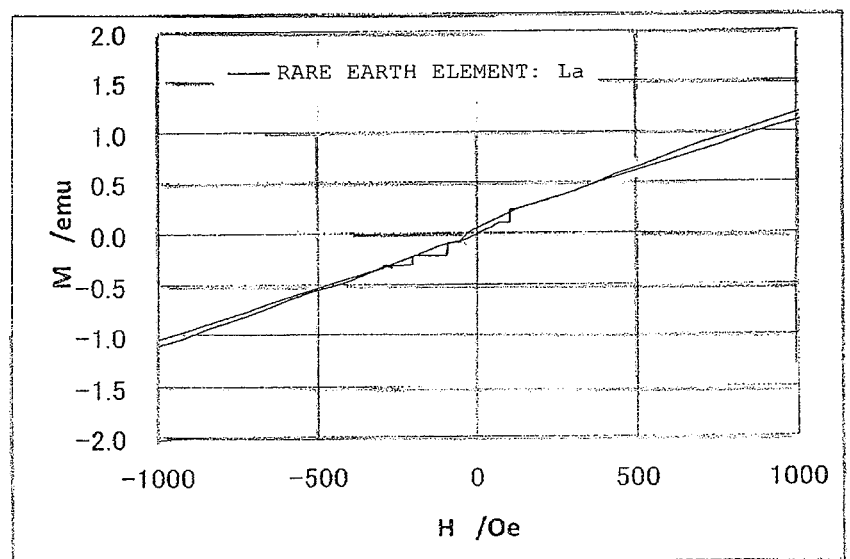
Fig 9(B)

Fig. 10(A)
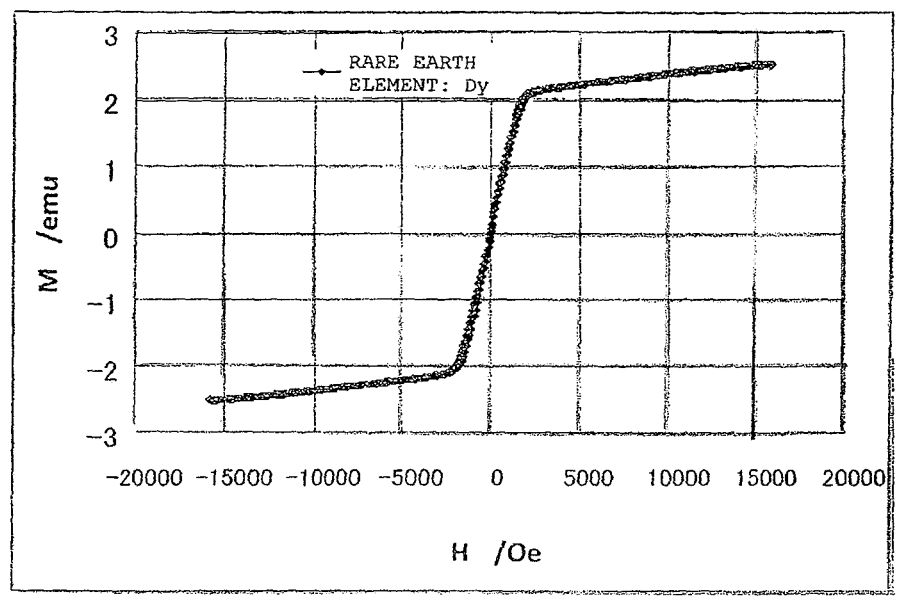
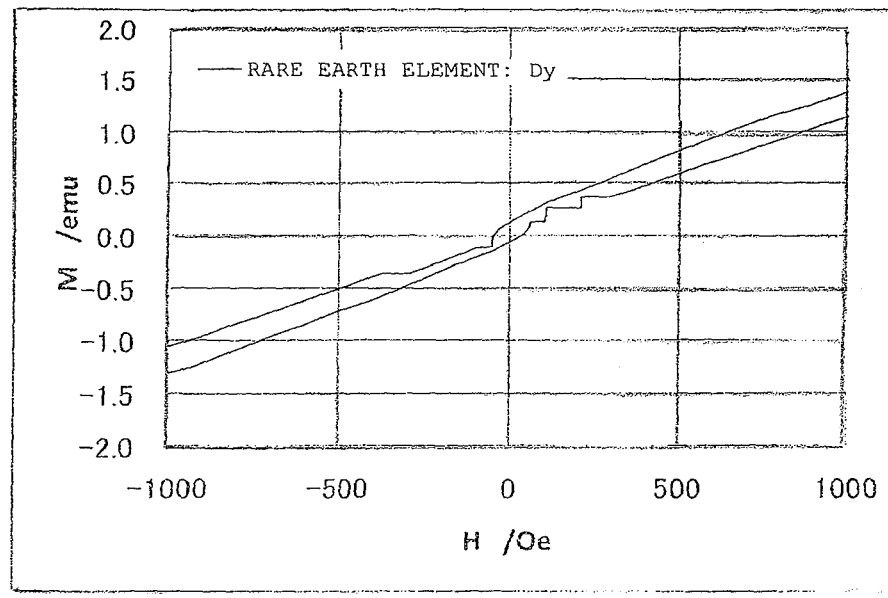
Fig. 10(B)

Fig. 11(A)
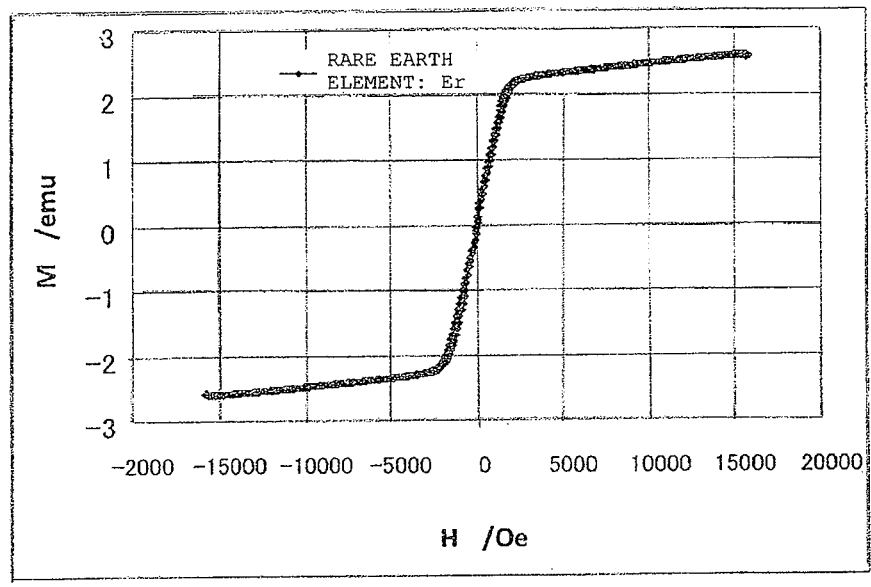
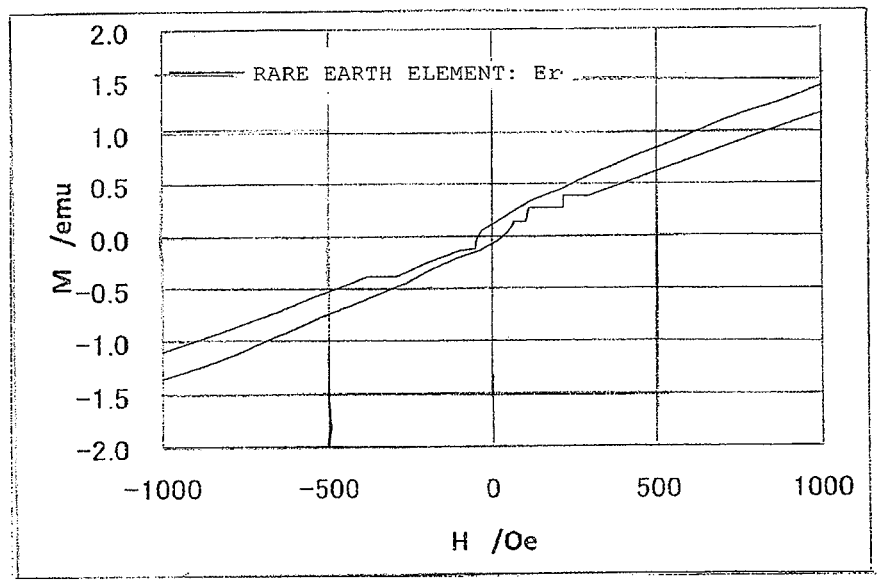
Fig 11(B)

Fig. 12(A)
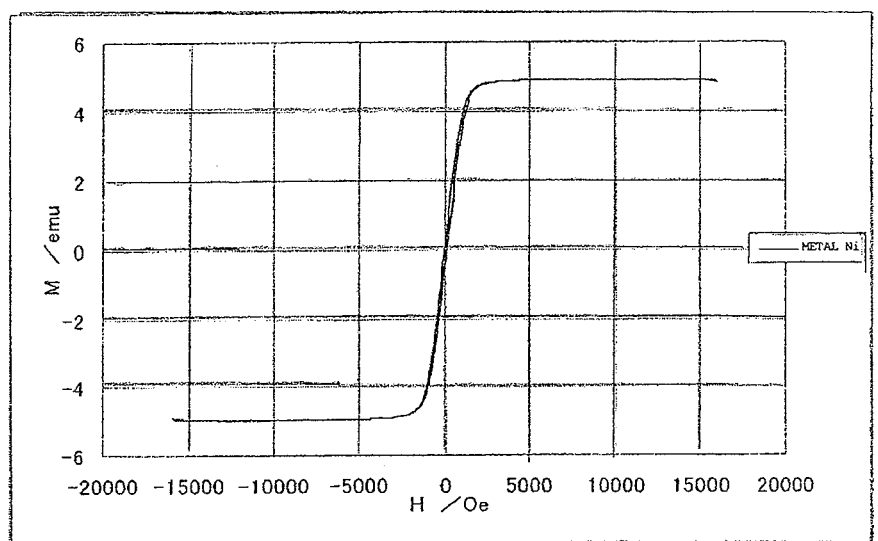
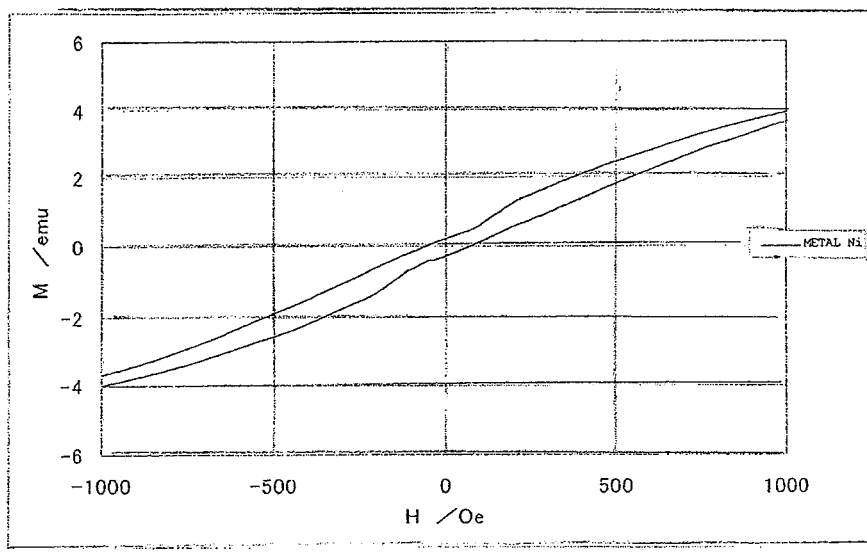
Fig. 12(B)

Fig. 13(A)
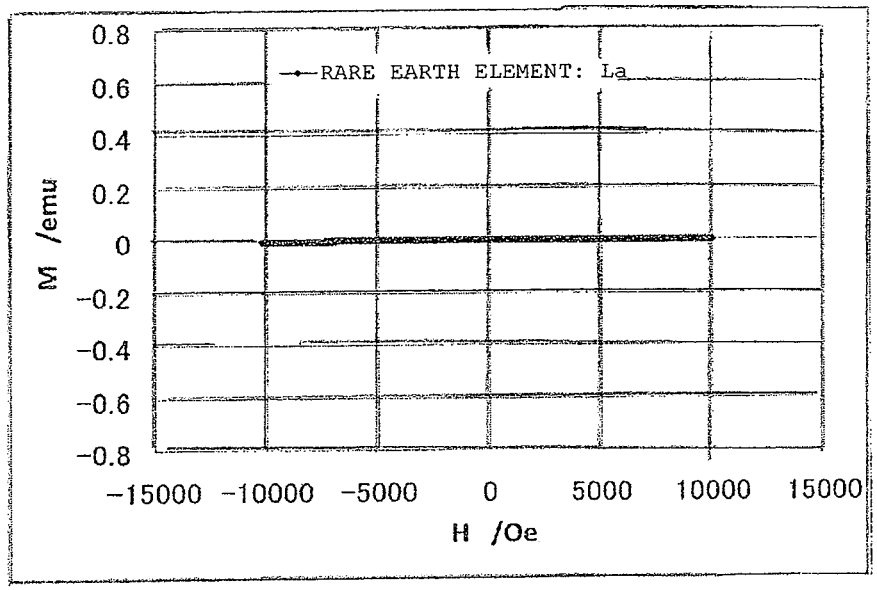
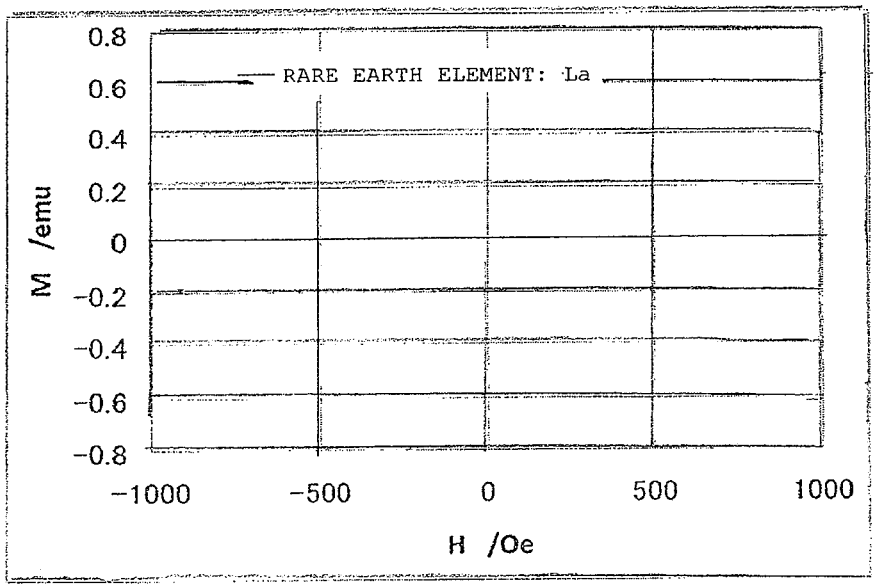
Fig. 13(B)

Fig. 14(A)
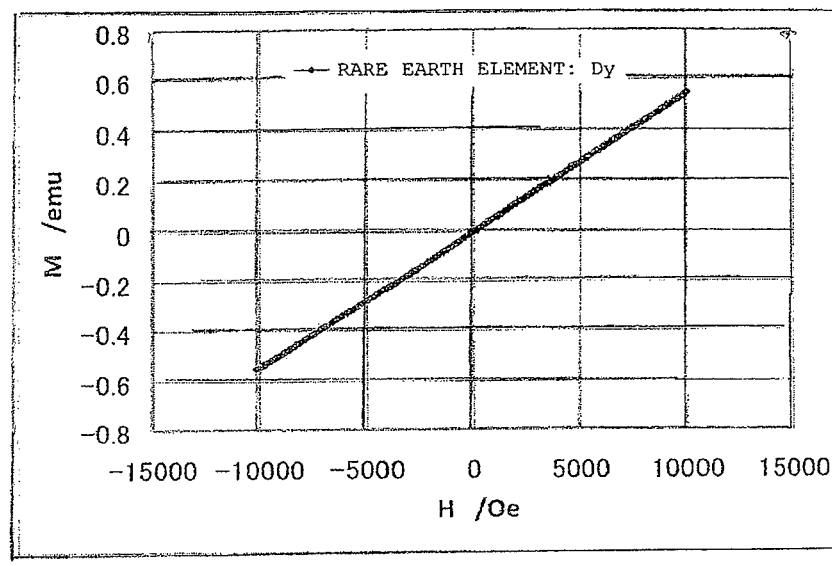
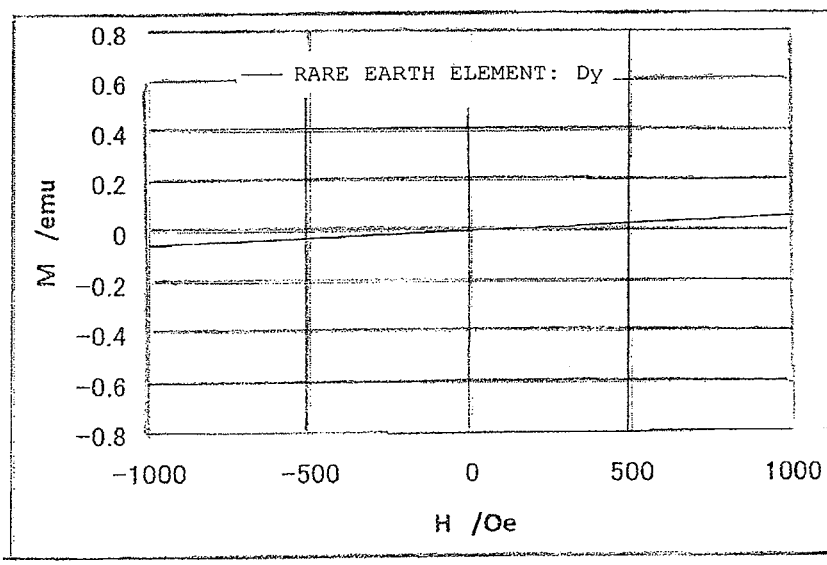
Fig 14(B)

Fig. 15(A)
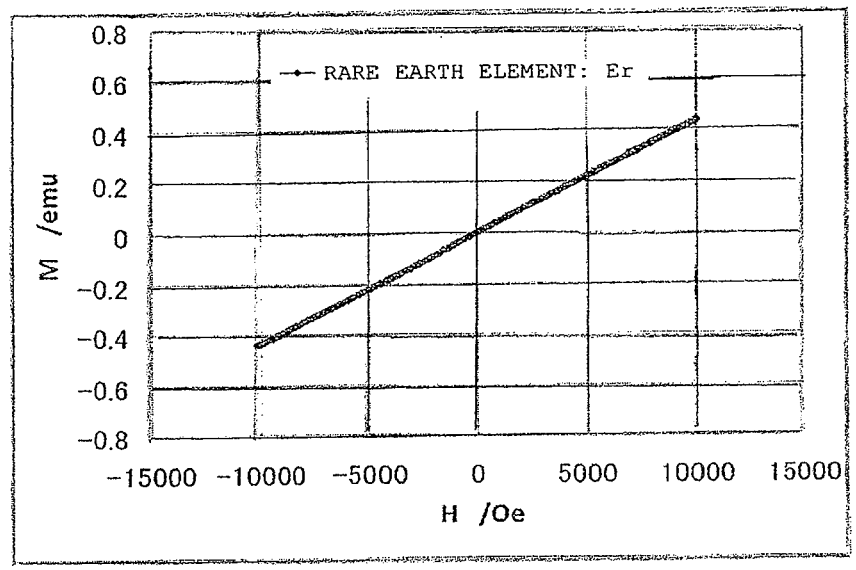
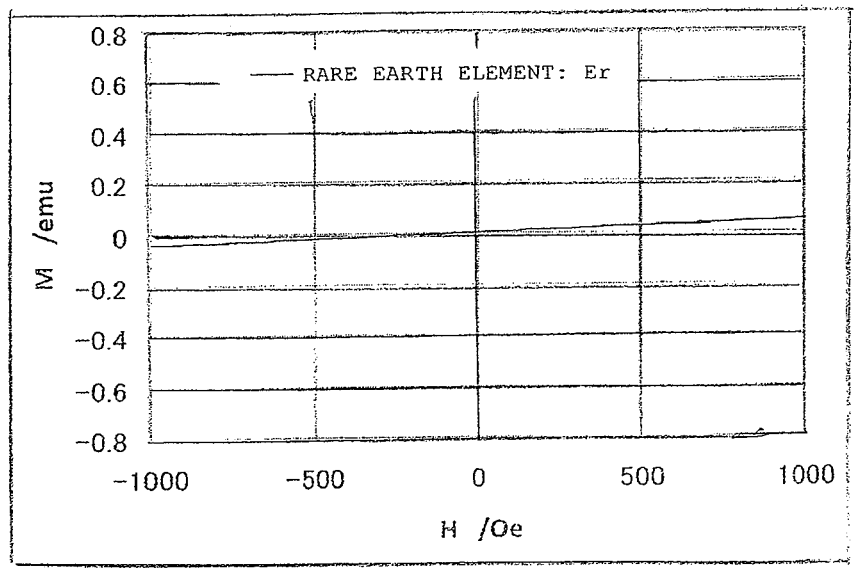
Fig 15(B)

Fig. 16(A)
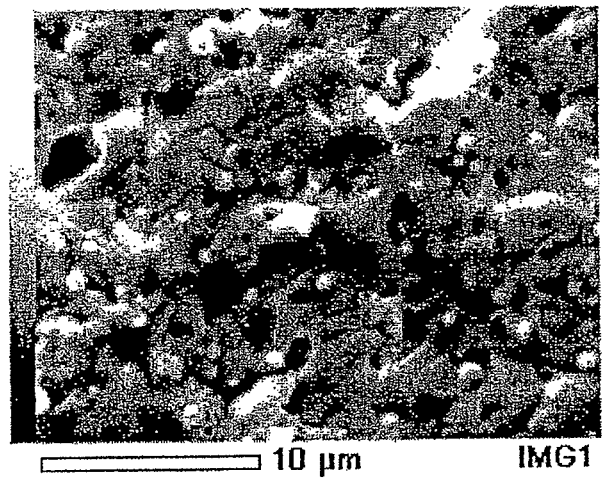
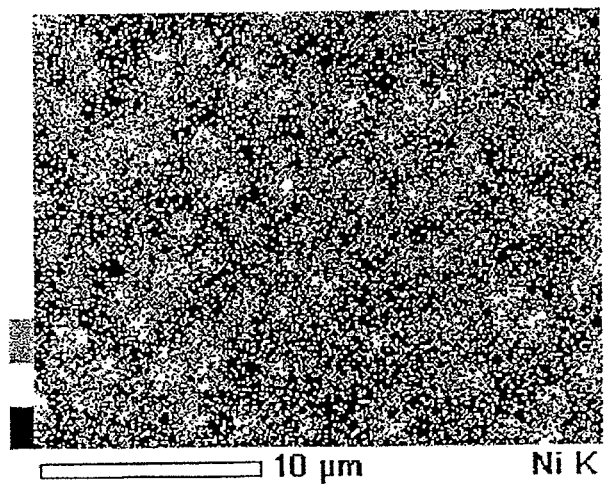
Fig. 16(B)

SEMICONDUCTOR CERAMIC AND SEMICONDUCTOR CERAMIC ELEMENT

This is a continuation of application Serial Number PCT/JP2012/050773, filed Jan. 17, 2012, the entire contents of which are incorporated herein by reference.

TECHNICAL FIELD

The present invention relates to a semiconductor ceramic and a semiconductor ceramic element constructed by using it, particularly, a semiconductor ceramic element that can be used as a temperature sensor.

BACKGROUND ART

Nowadays, it is urgently desired to improvem temperature sensing precision in a temperature sensor. In particular, a high-temperature state in a Li ion battery or CPU is liable to be brought about during operation, and also the operation is liable to become unstable in the high-temperature state. For this reason, there is a high need to sense the temperature within the apparatus accurately and therefore, a temperature sensor having a high precision is demanded.

The temperature sensor, a sensor using Pt, or an NTC thermistor using an oxide of a transition metal element such as Mn, Ni, Co, or Fe is well known. However, the former sensor has the disadvantage of being expensive because the sensor uses Pt which is a noble metal. On the other hand, the latter NTC thermistor has a disadvantage of having a low temperature sensing precision because the resistance change relative to the temperature is small.

As disclosed in the non-patent document 1 or the patent document 1, an element using metal-insulator transition is known as an element that can realize a sharp resistance change.

The non-patent document 1 discloses the electric and magnetic characteristics of a perovskite-structure oxide ($RTiO_3$) of a rare earth element R and titanium where La, Pr, Nd, Sm, and Y are selected as the rare earth element R, or $RCaTiO_3$ in which the Ca, which is an alkaline earth metal element, is dissolved to form a solid solution. As shown in FIG. 5 of this non-patent document 1, the magnetic state of the material system in $RTiO_3$ changes dramatically with a boundary located at a low-temperature region around about 100 K (−173° C.) (which is referred to as metal-insulator transition), thereby exhibiting a behavior of what is known as a strongly correlated electron system. Also, the electric characteristics are shown in FIG. 1 and FIG. 8, where the resistance temperature curve changes around 50 to 150 K.

The patent document 1 discloses a temperature sensor constructed by forming a thin film of vanadium oxide ($VO_2$), which generates metal-insulator transition at about 65° C., on a substrate.

However, the temperature at which the metal-insulator transition in the non-patent document 1 is exhibited is as low as −223° C. to −123° C., and specific magnetism temperature characteristics and resistance temperature characteristics are exhibited only in an extremely low-temperature region. Therefore, the above-described characteristics cannot be used under a temperature (for example, −25° C. to +85° C., which is hereafter referred to as "temperature of actual use") at which a general consumer may actually use an electronic apparatus.

With respect to the patent document 1, the $VO_2$ thin film exhibits a sharp metal-insulator transition at 65° C., which is within a range of the temperature of actual use. However, as will be understood from the known fact that when a thermal change above and below 65 to 70° C. is given to a $VO_2$ single crystal, the crystal will decay into pieces, $VO_2$ itself has a disadvantage of being extremely brittle. For this reason, there is a problem in that it is difficult to use $VO_2$ in an electronic component. Also, the $VO_2$ thin film in the patent document 1 is fabricated by a thin film forming method, thereby raising a problem of poor productivity.

PRIOR ART DOCUMENTS

Patent Document

Patent Document 1: JP 2009-511899 W

Non-Patent Document

Non-Patent Document 1: T. Katsufuji, Y. Taguchi and Y. Tokura, "Transport and magnetic properties of a Mott-Hubbard system whose bandwidth and band filling are both controllable: R1-xCaxTiO3+y/2", Phys. Rev. B 56 (1997) 10145

DISCLOSURE OF THE INVENTION

Problem to be Solved by the Invention

Therefore, an object of the this invention is to provide a semiconductor ceramic that generates metal-insulator transition at a temperature of actual use and has a sufficient strength to enable easy handling, as well as a semiconductor ceramic element constructed by using the same.

Means for Solving the Problem

A semiconductor ceramic according to the present invention comprises a perovskite-type or pyrochlore-type oxide containing a rare earth element, nickel, and titanium, wherein a part of the nickel is present as metal nickel.

The metal nickel is preferably dispersed in the semiconductor ceramic.

This invention is also directed to a semiconductor ceramic element constructed by using the above-described semiconductor ceramic. A semiconductor ceramic element according to the present invention comprises an element main body including the semiconductor ceramic and a pair of electrodes formed to interpose at least a part of the element main body therebetween.

The semiconductor ceramic element according to this invention can be advantageously used, for example, as a temperature sensor adapted to sense a temperature by a resistance change generated at a temperature of −25° C. to +85° C., that is, in a temperature range of actual use.

Effects of the Invention

It has been found out that the semiconductor ceramic according to this invention shows a sharp resistance change (CRT characteristics) in a temperature region of around 0° C. to +80° C., which is within a temperature range of actual use. Therefore, a semiconductor ceramic element constructed by using this semiconductor ceramic can be advantageously used as a temperature sensor adapted to sense a temperature by a resistance change generated in the temperature range of actual use.

Also, the semiconductor ceramic according to this invention can exhibit stable characteristics in a bulk state, and hence has a sufficient strength to enable easy handling and also provides a high productivity. Therefore, by using this semiconductor ceramic, a practical semiconductor ceramic element can be produced at a low cost.

The above-described characteristics provided by the semiconductor ceramic according to this invention are found to be generated by the presence of a part of the nickel in the semiconductor ceramic as metal nickel. A definite mechanism on the exhibited characteristics is not made clear yet; however, it is inferred to be as follows.

For example, an oxide containing a rare earth element and titanium and not containing nickel does not exhibit the above-described CRT characteristics. On the other hand, metal nickel does not exhibit the CRT characteristics because metal nickel shows metallic conduction. From these facts, it is inferred that the above-described CRT characteristics are exhibited as a result of interaction between metal nickel and an oxide containing a rare earth element and titanium.

In other words, it is generally known that metal nickel is a ferromagnetic substance having a large magnetic moment as a whole because adjacent spins are arranged to be directed in the same direction. It can be inferred that this large magnetic moment influences the spin of the atoms constituting the oxide containing a rare earth element and titanium, thereby influencing the electric characteristics to exhibit the CRT characteristics.

BRIEF EXPLANATION OF DRAWINGS

FIG. 5(A) is a view illustrating the resistance temperature characteristics of a semiconductor ceramic obtained in an Experiment Example, and FIG. 5(B) is one in which a depiction of gradient is added to the characteristic view of FIG. 5(A), showing a case in which La among the lanthanoids is used as a rare earth element.

FIG. 9(A) is a view illustrating the magnetic characteristics of a semiconductor ceramic according to this invention, and FIG. 9(B) is a partially enlarged view of FIG. 9(A), showing a case in which La among the lanthanoids is used as a rare earth element.

FIG. 10(A) is a view illustrating the magnetic characteristics of a semiconductor ceramic according to this invention, and FIG. 10(B) is a partially enlarged view of FIG. 10(A), showing a case in which Dy among the lanthanoids is used as a rare earth element.

FIG. 11(A) is a view illustrating the magnetic characteristics of a semiconductor ceramic according to this invention, and FIG. 11(B) is a partially enlarged view of FIG. 11(A), showing a case in which Er among the lanthanoids is used as a rare earth element.

FIG. 12(A) is a view illustrating the magnetic characteristics of a metal nickel single body as a Comparative Example, and FIG. 12(B) is a partially enlarged view of FIG. 12(A).

FIG. 13(A) is a view illustrating the magnetic characteristics of La—Ti—O as a Comparative Example, and FIG. 13(B) is a partially enlarged view of FIG. 13(A).

FIG. 14(A) is a view illustrating the magnetic characteristics of Dy—Ti—O as a Comparative Example, and FIG. 14(B) is a partially enlarged view of FIG. 14(A).

FIG. 15(A) is a view illustrating the magnetic characteristics of Er—Ti—O as a Comparative Example, and FIG. 15(B) is a partially enlarged view of FIG. 15(A).

FIG. 16(A) is an SEM photograph of a semiconductor ceramic according to this invention, and FIG. 16(B) is an EDX photograph of Ni of the semiconductor ceramic according to this invention, showing a case in which La among the lanthanoids is used as a rare earth element.

DESCRIPTION OF THE INVENTION

Figure 1:
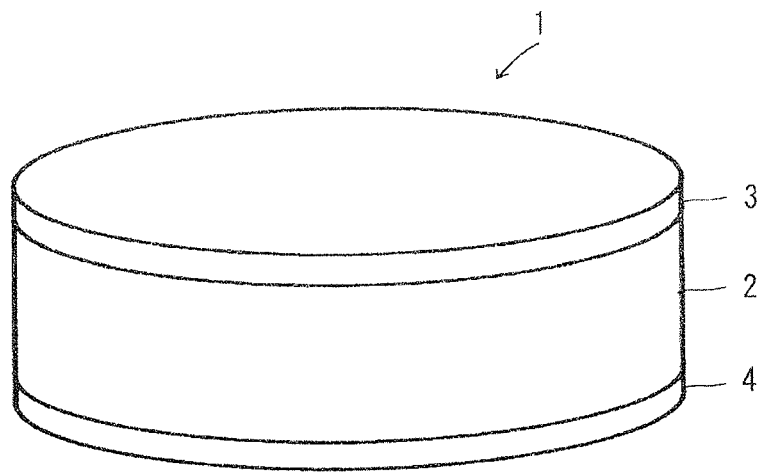
FIG. 1 is a perspective view illustrating an outer appearance of a semiconductor ceramic element 1 according to one embodiment of the present invention.

With reference to FIG. 1, a semiconductor ceramic element 1 according to one embodiment of this invention will be described.

The semiconductor ceramic element 1 includes an element main body 2 made of a semiconductor ceramic and a pair of electrodes 3 and 4 formed respectively on the opposing principal surfaces of the element main body 2.

The semiconductor ceramic constituting the element main body 2 is constituted of a perovskite-type or pyrochlore-type oxide containing a rare earth element, nickel, and titanium. Further, a part of the aforesaid nickel is present as metal nickel in the semiconductor ceramic. Such metal nickel is preferably obtained by reduction of the nickel contained in the perovskite-type or pyrochlore-type oxide, so that the metal nickel is dispersed in the semiconductor ceramic. The amount of Ni in the oxide and as metal can be adjusted to achieve a desired CRT characterisitics.

As will be made clear from the later-described Experiment Example, the semiconductor ceramic element 1 can be advantageously used as a temperature sensor adapted to sense a temperature by a resistance change generated in a temperature range of actual use.

In order to produce the semiconductor ceramic element 1 such as this, the following steps are carried out, for example.

First, a rare earth element is blended at a predetermined ratio with titanium oxide and nickel oxide, and a dispersant and pure water are added. The resultant combination is subjected to wet-type mixing and crushing by a mixing and crushing apparatus such as an attritor or a ball mill for several hours.

The source material powder obtained in the above-described manner is dried and thereafter calcined at a temperature of 650 to 1300° C. Subsequently, after a dispersant and pure water are added, the resultant combination is subjected to wet-type mixing and crushing by a mixing and crushing apparatus such as an attritor or a ball mill for several hours.

Next, a dispersant, pure water, and a water-type binder are added to the calcined source material powder. The resultant is then subjected to wet-type mixing and crushing by a mixing and crushing apparatus such as an attritor or a ball mill for several hours, followed by drying.

The source material powder having passed through the above drying process is then subjected, for example, to press-molding to obtain an element main body not yet fired.

On the element main body not yet fired, a debindering and firing step is carried out to obtain a sintered element main body 2. By allowing the firing atmosphere in this firing step to be, for example, a mixed gas atmosphere made of nitrogen and hydrogen or a mixed gas atmosphere made of argon and hydrogen and controlling the oxygen partial pressure to be below or equal to a predetermined value, a part of the nickel oxide contained in the element main body not yet fired is reduced to become metal nickel.

The above-mentioned firing atmosphere will be described in detail. It is known from thermodynamics that at 1300° C., for example, when the oxygen partial pressure within a firing furnace is set to be about $10^{-9}$ MPa or below, nickel oxide is reduced to metal nickel. This is described, for example, in "F. D. Richardson and J. H. E. Jeffes, "The Thermodynamics of Substances of Interest in Iron and Steel Making from 0° C. to 2400° C.", JOURNAL OF THE IRON AND STEEL INSTITUTE, (1948), p. 261".

For this reason, when a firing process is carried out by setting the oxygen partial pressure to be, for example, $10^{-10}$ MPa or below, the oxide made of a rare earth element and titanium (it being inferred that a part of the nickel is dissolved in this oxide to form a solid solution) and the metal nickel can be made to coexist with each other in the obtained element main body 2.

On the sintered element main body 2, a grinding step is carried out to arrange the shape, and thereafter an electrode paste film containing a noble metal such as Ag, Ag—Pd, Au, or Pt as a major component, for example, is formed on each principal surface thereof, followed by performing a plating process to form the electrodes 3 and 4.

In the above-described manner, the semiconductor ceramic element 1 can be obtained.

Next, a semiconductor ceramic element according to this invention will be specifically described by way of an Experiment Example.

(1) Fabrication of Sample

First, a lanthanoid serving as a rare earth element was blended with titanium oxide and nickel oxide at a ratio of lanthanoid/Ti/Ni=0.5/0.25/0.25 (mol %), and an ammonium polycarboxylate type dispersant and pure water were added. The resultant was then subjected to wet-type mixing and crushing by a ball mill for several hours. In this Experiment Example, La (lanthanum) having an atomic number of 57, Dy (dysprosium) having an atomic number of 66, and Er (erbium) having an atomic number of 68 were selected as the lanthanoid.

After the source material powder obtained in the above-described manner was dried, the source material powder was calcined at a temperature of 1200° C., and subsequently, an ammonium polycarboxylate type dispersant and pure water were added. The resultant was then subjected to wet-type crushing by a ball mill for several hours.

Next, an ammonium polycarboxylate type dispersant, pure water, and a polyvinyl alcohol type binder serving as a water-type binder were added to the calcined source material powder. The resultant combination was then subjected to wet-type mixing and crushing by a ball mill for several hours, followed by drying.

The source material powder having passed through the above drying process was subjected to press-molding at a pressing pressure of about 1000 kg/cm$^2$ to obtain an element main body not yet fired and having a disk shape with a diameter of about 10 mm and a thickness of about 2.5 mm.

Next, after a debindering step was carried out on this element main body not yet fired, firing was carried out at a top temperature of 1300° C. while adjusting the temperature-raising speed and the temperature-lowering speed to be 3.3 to 10° C./min, thereby to obtain a sintered element main body. The firing atmosphere in this firing step was set to be a mixed gas atmosphere made of nitrogen and hydrogen, and the oxygen partial pressure was set to be $10^{-10}$ MPa or below. The sintered element main body had a disk shape with a diameter of about 8.5 mm and a thickness of about 2.2 mm.

On the sintered element main body, a grinding step was carried out to shape the body, and thereafter an electrode paste film containing Ag as a major component was formed on each principal surface thereof, followed by performing a plating process to form the electrodes, thereby to obtain a semiconductor ceramic element serving as a sample.

(2) XRD Analysis

In order to confirm that a part of nickel oxide is reduced to become metal nickel in the semiconductor ceramic constituting the element main body of the semiconductor ceramic element serving as a sample, XRD analysis was carried out on the semiconductor ceramic.

Figure 2:
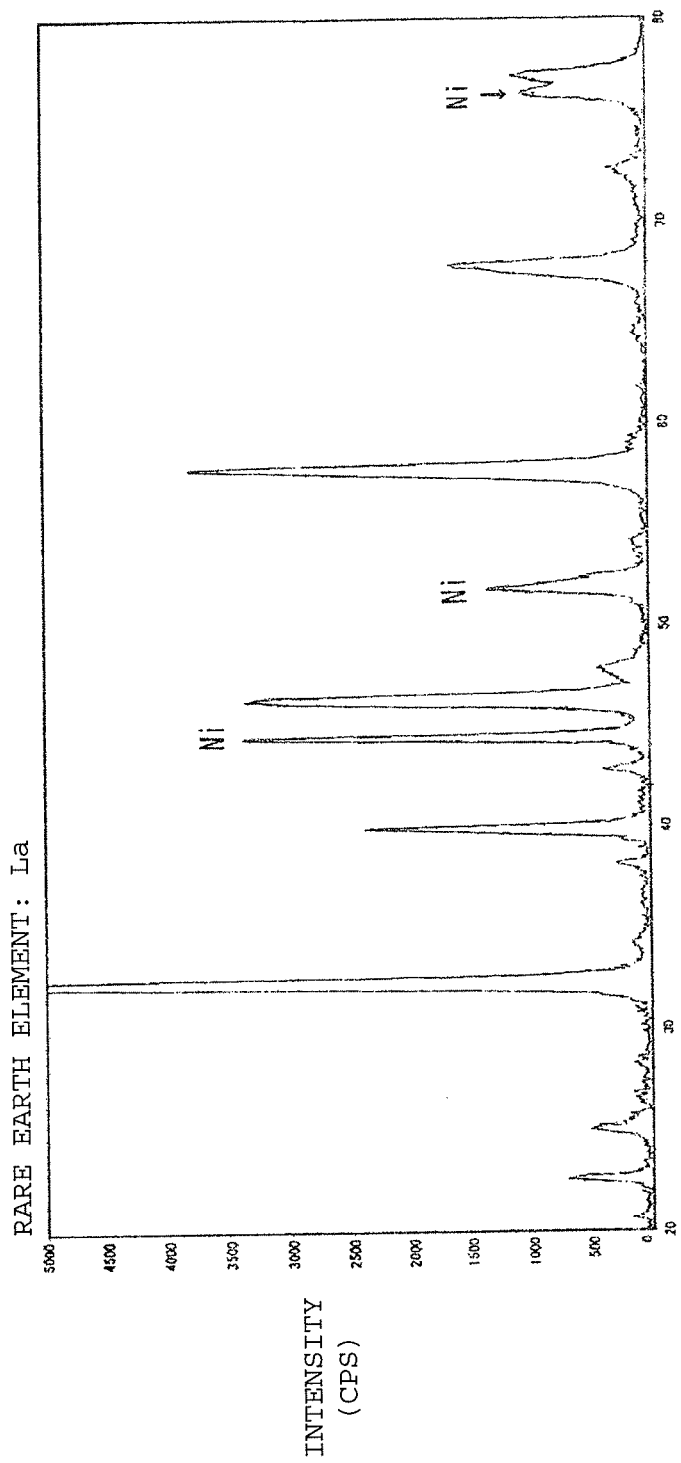
FIG. 2 is a view illustrating a result of XRD analysis of a semiconductor ceramic obtained in an Experiment Example, showing a case in which La among the lanthanoids is used as a rare earth element.
Figure 3:
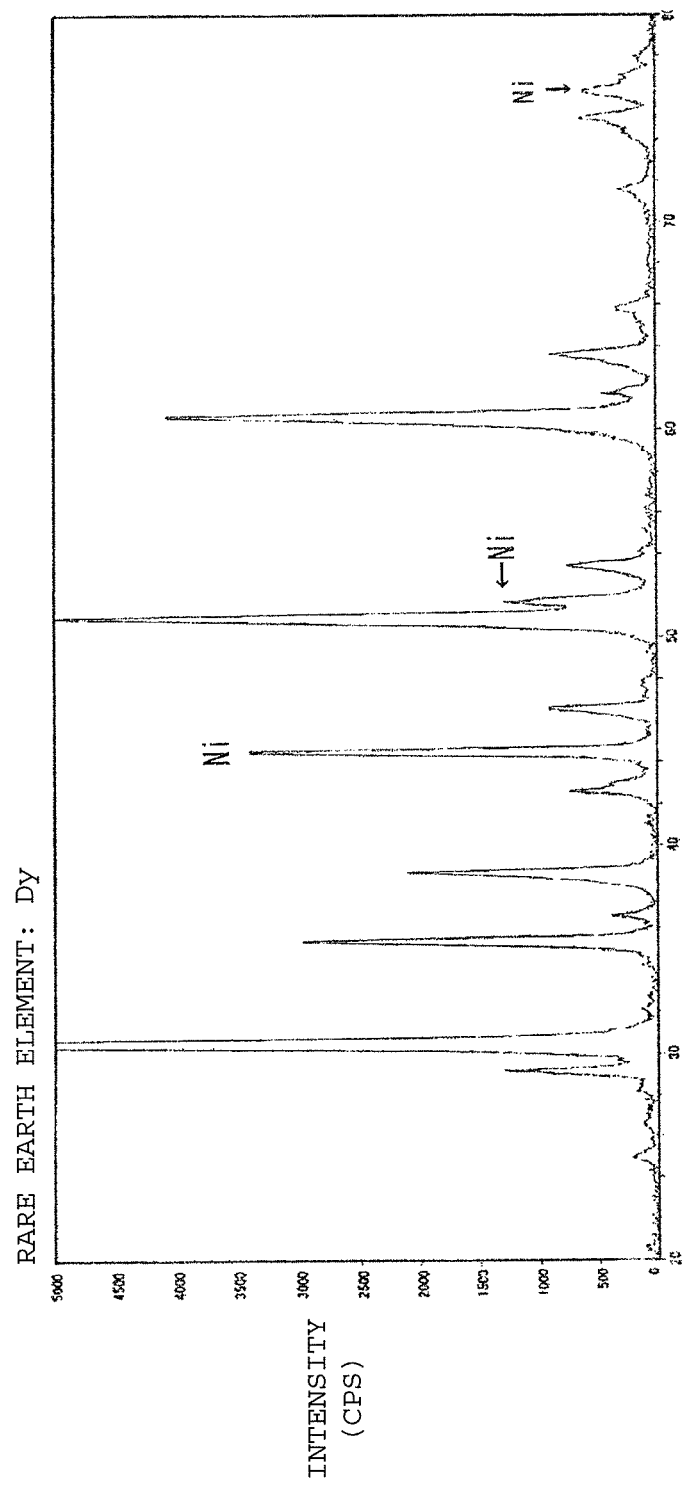
FIG. 3 is a view illustrating a result of XRD analysis of a semiconductor ceramic obtained in an Experiment Example, showing a case in which Dy among the lanthanoids is used as a rare earth element.
Figure 4:
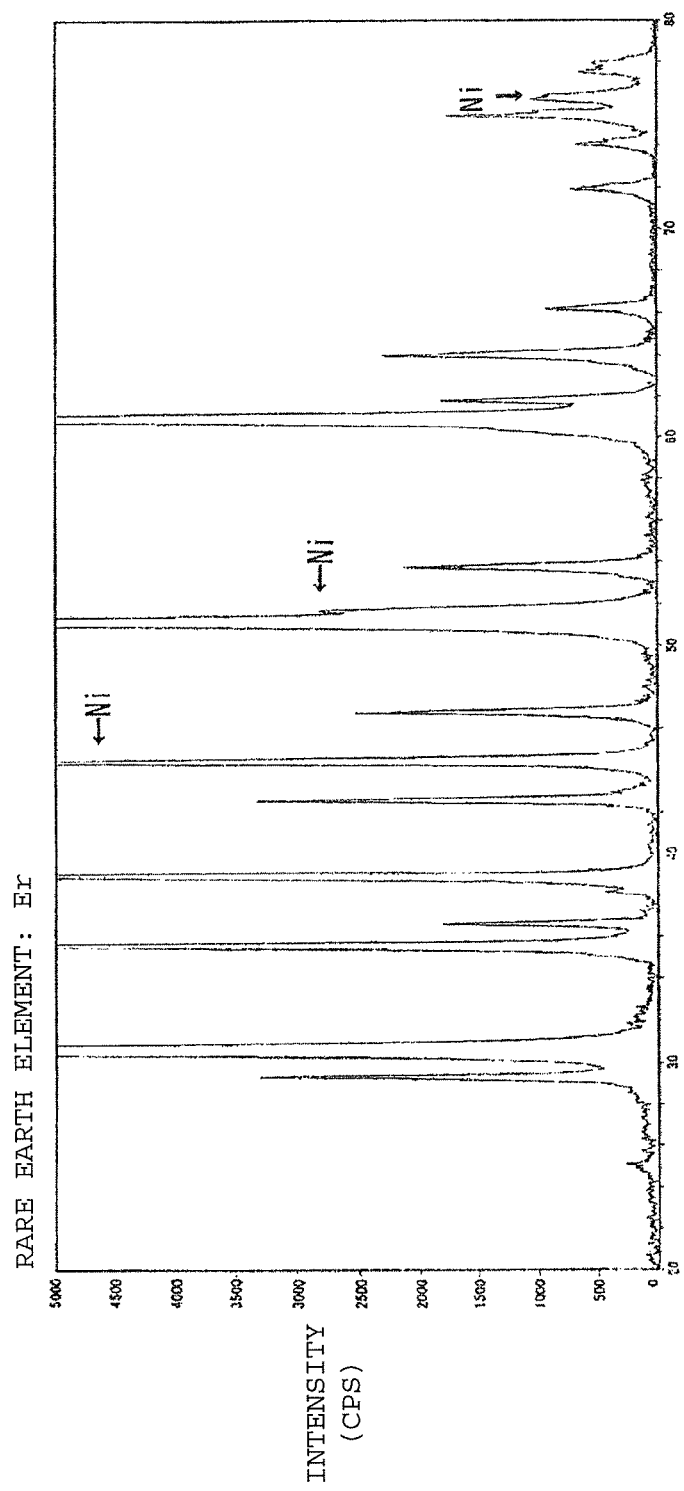
FIG. 4 is a view illustrating a result of XRD analysis of a semiconductor ceramic obtained in an Experiment Example, showing a case in which Er among the lanthanoids is used as a rare earth element.

FIGS. 2 to 4 show the result of XRD analysis. Here, FIG. 2 shows the case in which La is used as the lanthanoid; FIG. 3 shows the case in which Dy is used as the lanthanoid; and FIG. 4 shows the case in which Er is used as the lanthanoid.

As shown in FIG. 2, LaTiO$_3$ (nickel dissolved therein to form a solid solution) having a perovskite structure and metal nickel were detected in the La—Ti—Ni system.

As shown in FIG. 3, Dy$_2$Ti$_2$O$_7$ (nickel being dissolved to form a solid solution) having a pyrochlore structure and metal nickel were detected in the Dy—Ti—Ni system.

As shown in FIG. 4, Er$_2$Ti$_2$O$_7$ (nickel being dissolved to form a solid solution) having a pyrochlore structure and metal nickel were detected in the Er—Ti—Ni system.

In other words, while the crystal structure of a semiconductor ceramic is classified into a perovskite structure or a pyrochlore structure depending on the ion radius of the lanthanoid, it has been confirmed that metal nickel is generated in all of the samples.

(3) Evaluation of Electric Characteristics

The resistance temperature characteristics were determined for the semiconductor ceramic constituting the element main body of the semiconductor ceramic element of each sample. The measurement temperature range was set to be −170° C. to +250° C., and four-terminal measurement was carried out. As the measurement device, type number 2430 manufactured by KEITHLEY Co., Ltd. was used.

Figure 6A:
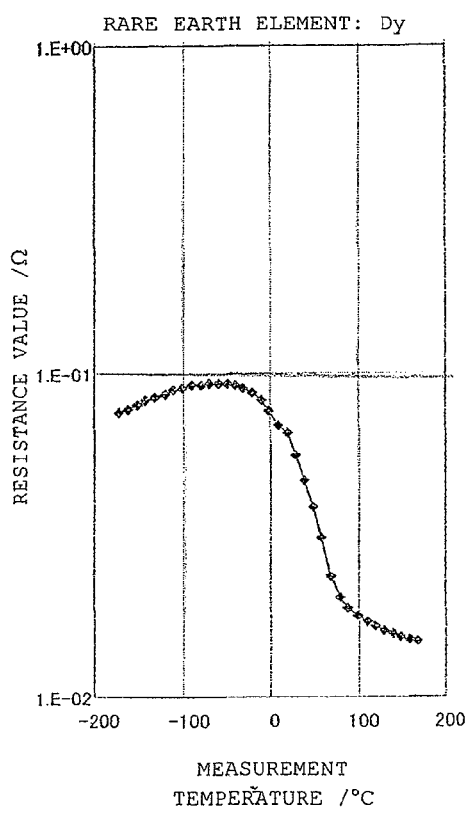
FIG. 6(A) is a view illustrating the resistance temperature characteristics of a semiconductor ceramic obtained in an Experiment Example.
Figure 6B:
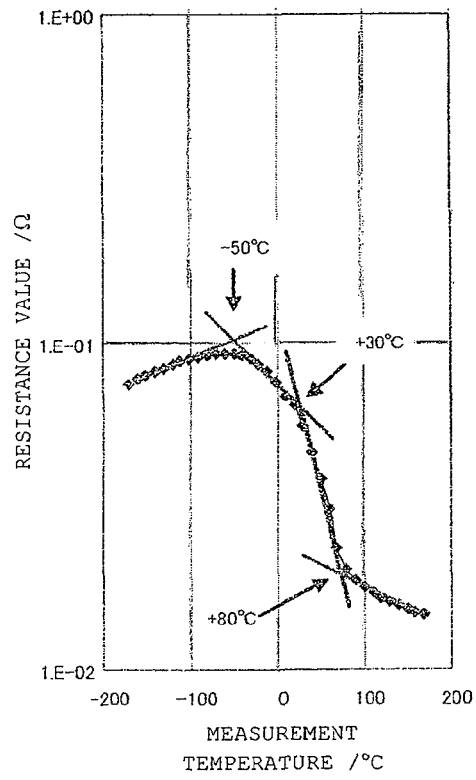
FIG. 6(B) is one in which a depiction of gradient is added to the characteristic view of FIG. 6(A), showing a case in which Dy among the lanthanoids is used as a rare earth element.
Figure 7A:
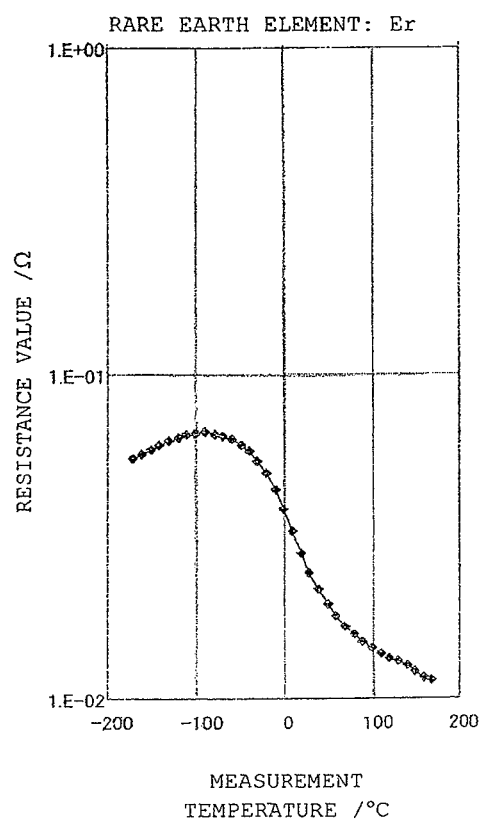
FIG. 7(A) is a view illustrating the resistance temperature characteristics of a semiconductor ceramic obtained in an Experiment Example.
Figure 7B:
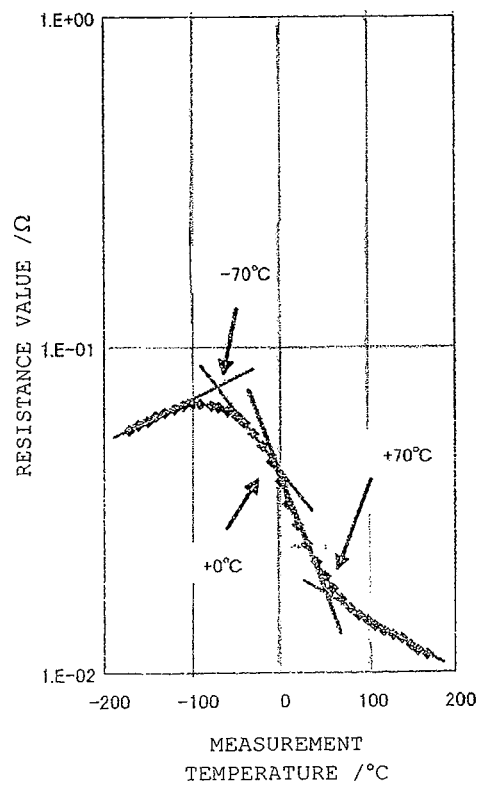
FIG. 7(B) is one in which a depiction of gradient is added to the characteristic view of FIG. 7(A), showing a case in which Er among the lanthanoids is used as a rare earth element.

FIGS. 5(A), 6(A), and 7(A) are views showing the resistance temperature characteristics of the semiconductor ceramic obtained in the Experiment Example, and FIGS. 5(B), 6(B), and 7(B) are views in which a depiction of gradient is added to the characteristic views of FIGS. 5(A), 6(A), and 7(A), respectively. FIG. 5 shows the case in which La is used as the lanthanoid; FIG. 6 shows the case in which Dy is used as the lanthanoid; and FIG. 7 shows the case in which Er is used as the lanthanoid.

As shown in FIG. 5, the resistance temperature characteristics were found to be sharp at +10° C. to +70° C. in the La—Ti—Ni system.

As shown in FIG. 6, the resistance temperature characteristics were found to be sharp at +30° C. to +80° C. in the Dy—Ti—Ni system.

As shown in FIG. 7, the resistance temperature characteristics were found to be sharp at +0° C. to +70° C. in the Er—Ti—Ni system.

The lanthanoids have a property of having a smaller ion radius as the atomic number increases, and it is known that, typically with respect to the valence number, a +3 valence is stable. The effect of adding the lanthanoids as a whole can be inferred by examining the physical properties on those being different in ion radius. Therefore, though only La, Dy, and Er are used as the lanthanoid in this Experiment Example, the result of physical properties obtained on these La, Dy, and Er can be regarded as those common to the lanthanoids from La having an atomic number of 57 to Er having an atomic number of 68 and further to the whole of rare earth elements including all of the lanthanoids from La having an atomic number of 57 to Lu having an atomic number of 71 as well as Sc and Y.

From the above, it has been confirmed that, according to a semiconductor ceramic made of a perovskite-type or pyrochlore-type oxide containing a rare earth element, nickel, and titanium wherein a part of the nickel is present as metal nickel, the characteristics (CTR characteristics) such that the resistance temperature characteristics become sharp at 0° C. to +80° C. which is within a temperature range of actual use can be realized.

Figure 8:
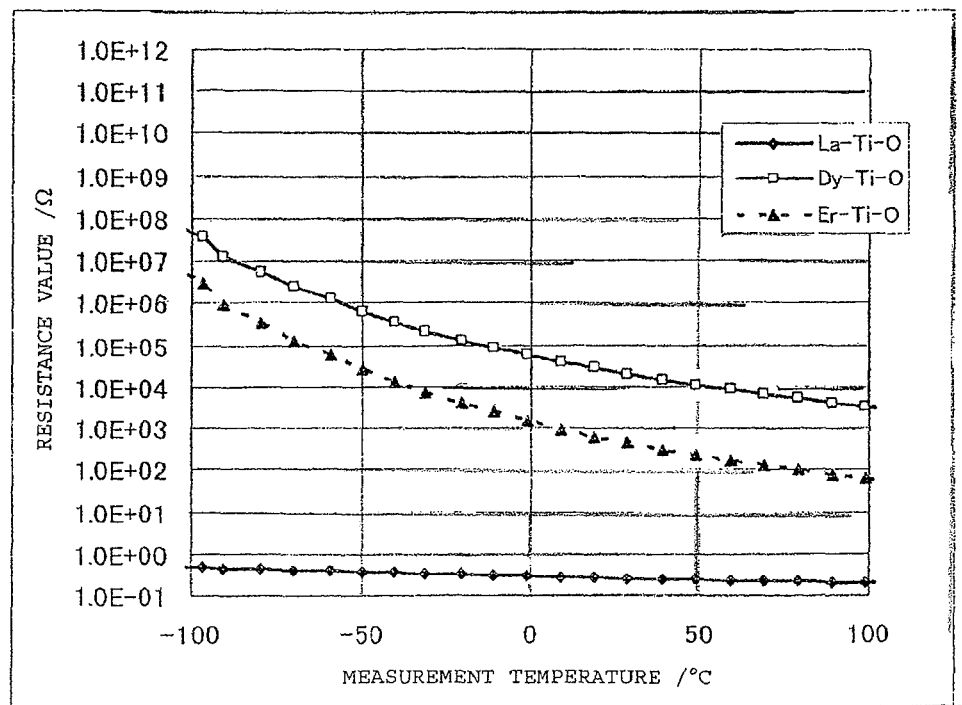
FIG. 8 is a view illustrating the resistance temperature characteristics of lanthanoids (La, Dy, Er)—Ti—O as a Comparative Example.

For the sake of comparison, the resistance temperature characteristics were evaluated also on the lanthanoid-Ti—O oxides that do not contain nickel while using each of La, Dy, and Er as the lanthanoid. FIG. 8 shows the resistance temperature characteristics thereof.

FIG. 8 shows that in the case of the lanthanoid-Ti—O oxides that do not contain nickel, sharp resistance temperature characteristics were not exhibited at least at 0° C. to +80° C. which is within a temperature range of actual use.

(4) Evaluation of Magnetic Characteristics

In order to obtain data showing that oxide and metal coexist in the semiconductor ceramic according to this invention, also the magnetic characteristics of the semiconductor ceramic were also evaluated.

In order not to let the state in which metal nickel is segregated on the sample surface be considered, the whole surface of the element main body obtained in the above-described manner was ground until the thickness became from about 2.2 mm to about 1.3 mm and until the diameter became from about 8.5 mm to about 6.0 mm. It can be grasped that the magnetic characteristics obtained from this sample represent the metal nickel state in the inside of the ceramic.

In evaluating the magnetic characteristics, the magnetization M when a magnetic field H was applied at 16 kOe at the maximum was measured at room temperature (25° C.). As the measurement device, a magnetometer of vibration sample type for measurement of temperature change (VSM-5-15 type) manufactured by Toei Industry Co., Ltd. was used.

FIGS. 9(A), 10(A), and 11(A) are views illustrating the magnetic characteristics of a semiconductor ceramic according to this invention, and FIGS. 9(B), 10(B), and 11(B) are partially enlarged views of FIGS. 9(A), 10(A), and 11(A), respectively. FIG. 9 shows the case in which La is used as the lanthanoid serving as the rare earth element; FIG. 10 shows the case in which Dy is used as the lanthanoid; and FIG. 11 shows the case in which Er is used as the lanthanoid.

FIGS. 9 to 11 show a hysteresis curve ($M \neq 0$ when $H=0$) indicating a ferromagnetic substance was obtained as the magnetic characteristics. From this, it can be considered that the semiconductor ceramic according to this invention is a ferromagnetic substance and that this property as the ferromagnetic substance derives from metal nickel. Also, a mode is seen from the result of magnetic characteristics such that the metal nickel coexists in the inside of the ceramic and is not in the state of being segregated on the ceramic surface.

In order to verify this further, the magnetic characteristics of a metal nickel single body and the magnetic characteristics of a lanthanoid-Ti—O oxide that does not contain nickel were also determined. The sample for determining the magnetic characteristics of a metal nickel single body was made to have a disk shape with a diameter of about 3.6 mm and a thickness of about 1.0 mm, and the sample for determining the magnetic characteristics of a lanthanoid-Ti—O oxide that does not contain nickel was made to have a disk shape with a diameter of about 6.0 mm and a thickness of about 1.3 mm.

FIG. 12 shows the magnetic characteristics of a metal nickel single body. Metal nickel is typically a ferromagnetic substance; when the magnetic characteristics were measured as a metal nickel single body, a hysteresis curve ($M \neq 0$ when $H=0$) indicating a ferromagnetic substance was obtained as shown in FIG. 12.

FIGS. 13 to 15 show the magnetic characteristics of a lanthanoid-Ti—O oxide that does not contain nickel. FIG. 13 shows the case in which La is used as the lanthanoid; FIG. 14 shows the case in which Dy is used as the lanthanoid; and FIG. 15 shows the case in which Er is used as the lanthanoid.

With respect to the lanthanoid-Ti—O oxide having a composition such that addition of nickel was eliminated from the semiconductor ceramic according to this invention, the magnetization M is also "0" when the magnetic field H is "0" as shown in FIGS. 13 to 15, and a hysteresis curve is not drawn. Therefore, it will be understood that the lanthanoid-Ti—O oxide is not a ferromagnetic substance.

From these, it is confirmed that the semiconductor ceramic according to this invention is a ferromagnetic substance and that this property as the ferromagnetic substance derives from metal nickel, as described before.

(5) Evaluation of a Dispersed State of Metal Nickel

In order to evaluate the dispersed state of metal nickel in the semiconductor ceramic according to this invention, an energy dispersion type X-ray spectrometry (EDX: Energy Dispersive X-ray Spectrometer) analysis was carried out by using a scanning-type electron microscope (SEM: Scanning Electron Microscope). As the analyzing apparatus, JSM-6390A manufactured by JEOL Co., Ltd. was used.

FIG. 16(A) shows an SEM photograph in the case in which La is used as a lanthanoid serving as the rare earth element, and FIG. 16(B) is an EDX photograph of Ni. From FIGS. 16(A) and 16(B), a mode in which nickel is segregated in a spot-like manner has been confirmed. The size thereof was as small as 0.3 µm to 2.0 µm. When seen from the SEM image, a spot-like object having a white contrast can be observed in the image, and this has been confirmed to be metal nickel. Also, the contrast provided by nickel appeared also in the parts other than the spot-like part. From this, it has been considered that a part of the nickel is dissolved in the ceramic to form a solid solution.

From the above, it has been found out that the metal nickel is dispersed in the ceramic in a spot-like manner having a size of 0.3 µm to 2.0 µm. Also, it has been found out that a part of the nickel is dissolved in the ceramic to form a solid solution.

Both in the case in which Dy is used and in the case in which Er is used, a mode in which nickel is segregated in a spot-like manner has been confirmed.

DESCRIPTION OF REFERENCE SYMBOLS

1 semiconductor ceramic element
2 element main body
3, 4 electrode

The invention claimed is:

1. A semiconductor ceramic comprising a perovskite or pyrochlore oxide containing Dy or Er, nickel, and titanium, wherein a part of said nickel is present as metal nickel, the semiconductor ceramic is a ferromagnetic substance, and the semiconductor ceramic element has resistance change characteristics relative to temperature that are larger in a temperature range of about 0° C. to +80° C. than at temperatures immediately on either side of said temperature range.

2. The semiconductor ceramic according to claim 1, wherein at least a part of said metal nickel is dispersed in the semiconductor ceramic.

3. A semiconductor ceramic element comprising:
   an element main body comprising a semiconductor ceramic according to claim 2; and
   a pair of electrodes disposed to interpose at least a part of said element main body therebetween.

4. The semiconductor ceramic element according to claim 3, which is a temperature sensor adapted to sense a temperature in accordance with a resistance change generated in a temperature range of −25° C. to +85° C.

5. A semiconductor ceramic element comprising:
   an element main body comprising a semiconductor ceramic according to claim 1; and
   a pair of electrodes disposed to interpose at least a part of said element main body therebetween.

6. The semiconductor ceramic element according to claim 5, which is a temperature sensor adapted to sense a temperature in accordance with a resistance change generated in a temperature range of −25° C. to +85° C.

* * * * *